(12) United States Patent
Kim

(10) Patent No.: US 9,778,985 B1
(45) Date of Patent: Oct. 3, 2017

(54) OPERATING METHOD OF DATA STORAGE DEVICE

(71) Applicant: SK hynix Inc., Gyeonggi-do (KR)

(72) Inventor: Sun Woong Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/362,011

(22) Filed: Nov. 28, 2016

(30) Foreign Application Priority Data

Aug. 17, 2016 (KR) .................. 10-2016-0104405

(51) Int. Cl.
  G06F 11/10 (2006.01)
  G06F 11/07 (2006.01)
  G11C 29/52 (2006.01)
  G06F 3/06 (2006.01)
  H03M 13/29 (2006.01)

(52) U.S. Cl.
  CPC .......... *G06F 11/1068* (2013.01); *G06F 3/064* (2013.01); *G06F 3/0619* (2013.01); *G06F 3/0679* (2013.01); *G06F 11/079* (2013.01); *G06F 11/0727* (2013.01); *G06F 11/0787* (2013.01); *G11C 29/52* (2013.01); *H03M 13/2906* (2013.01)

(58) Field of Classification Search
  CPC .................................. G06F 3/0619
  USPC .......................................... 365/163
  See application file for complete search history.

(56) References Cited

U.S. PATENT DOCUMENTS

| | | | | |
|---|---|---|---|---|
| 7,969,806 B2 * | 6/2011 | De Ambroggi | ..... | G06F 12/0238 365/148 |
| 8,351,290 B1 * | 1/2013 | Huang | ................. | G11C 16/349 365/218 |
| 9,417,959 B2 * | 8/2016 | Hsiao | ................... | G06F 11/1068 |
| 2009/0091968 A1 * | 4/2009 | Dietrich | ............. | G11C 13/0004 365/148 |
| 2016/0283325 A1 * | 9/2016 | Kwok | ............... | H03M 13/1515 |

FOREIGN PATENT DOCUMENTS

KR   1020110072279   6/2011

* cited by examiner

*Primary Examiner* — Hoai V Ho
*Assistant Examiner* — Muna A Techane
(74) *Attorney, Agent, or Firm* — IP & T Group LLP

(57) ABSTRACT

A method for operating a data storage device may include receiving first data; generating first flagged data by adding a first flag to the first data; generating first encoded flagged data by performing an encoding operation on the first flagged data; performing a first write operation for storing the first encoded flagged data in a target position of a phase change memory region; determining whether the first write operation succeeds or falls; generating second flagged data by adding a second flag to second data obtained by inverting the first data, when it is determined that the first write operation fails; generating second encoded flagged data by performing an encoding operation on the second flagged data; and performing a second write operation for storing the second encoded flagged data in the target position.

15 Claims, 16 Drawing Sheets

FIG.2

| Write original data | | | Write inverted data | |
|---|---|---|---|---|
| The number of memory cells in which stuck bits correspond to original bits | The number of memory cells in which stuck bits do not correspond to original bits =the number of error bits | | The number of memory cells in which stuck bits correspond to original bits | The number of memory cells in which stuck bits do not correspond to original bits =the number of error bits |
| 0 | 10 | → | 10 | 0 |
| 1 | 9 | → | 9 | 1 |
| 2 | 8 | → | 8 | 2 |
| 3 | 7 | → | 7 | 3 |
| 4 | 6 | → | 6 | 4 |
| 5 | 5 | | | |
| 6 | 4 | | | |
| 7 | 3 | | | |
| 8 | 2 | | | |
| 9 | 1 | | | |
| 10 | 0 | | | |

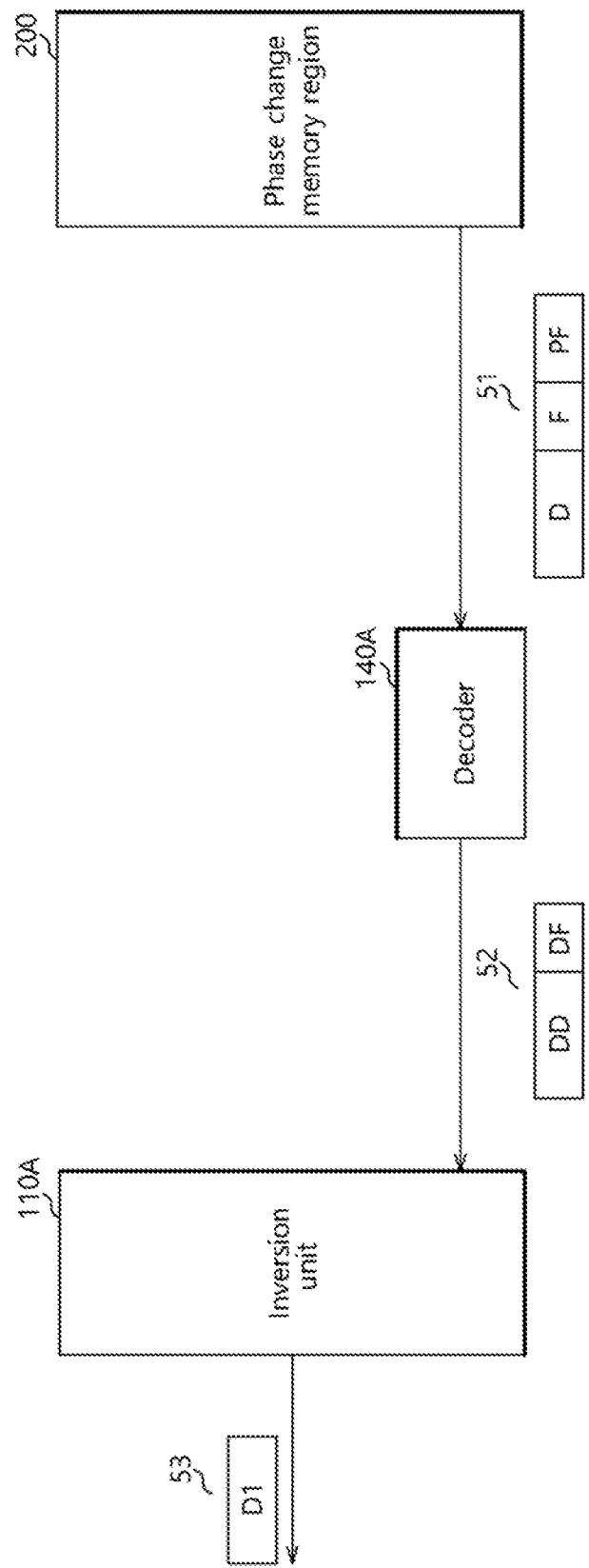

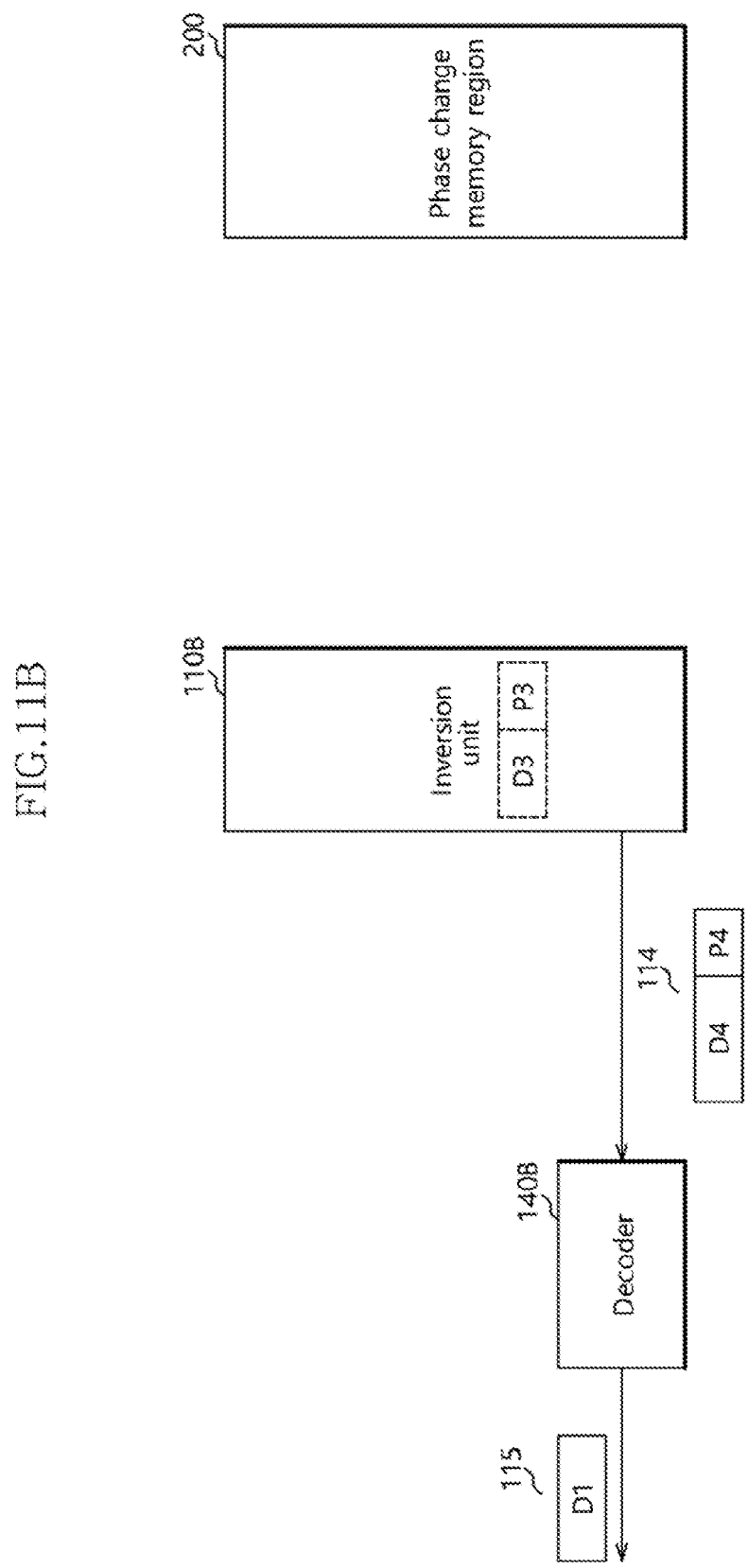

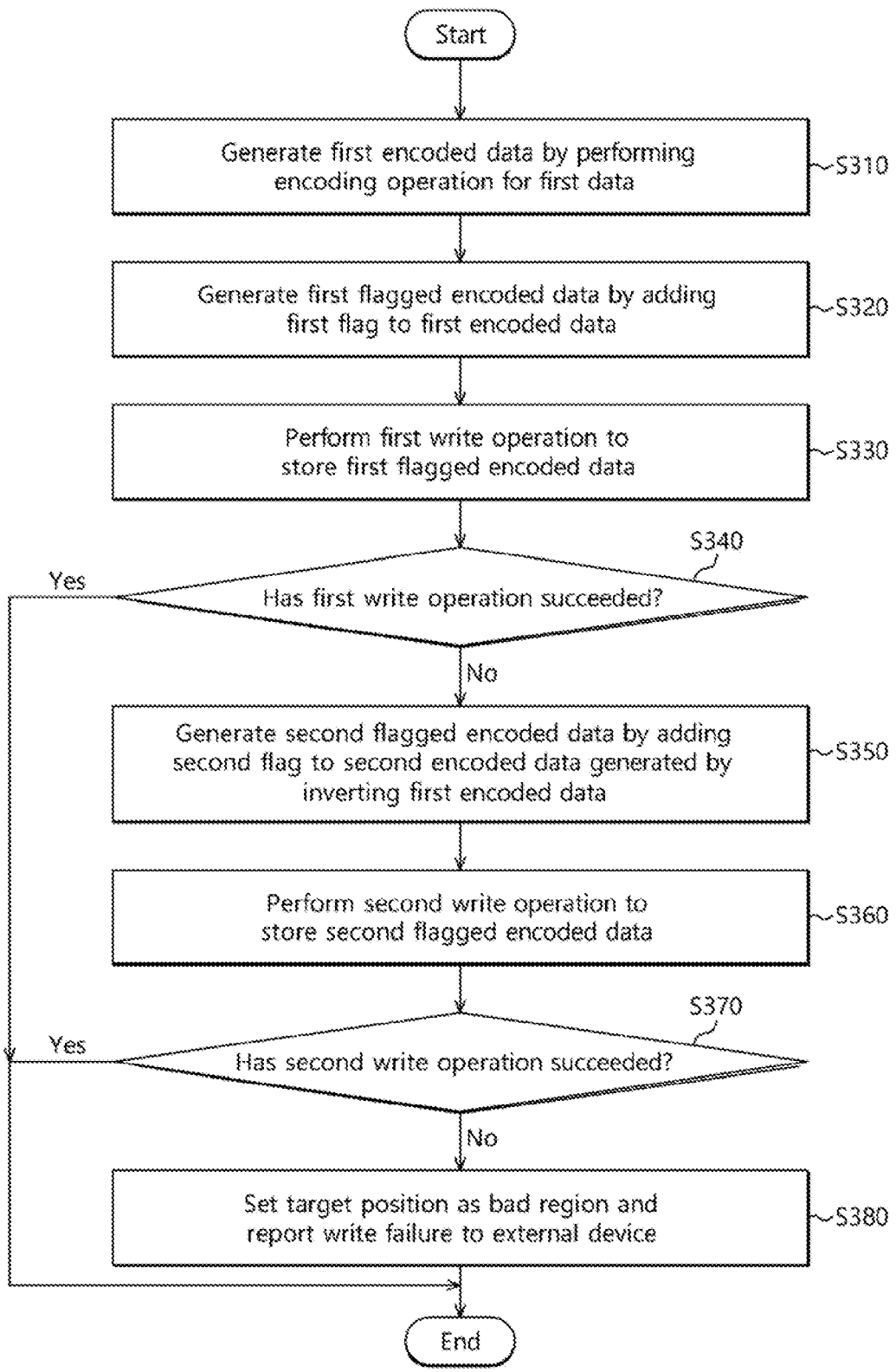

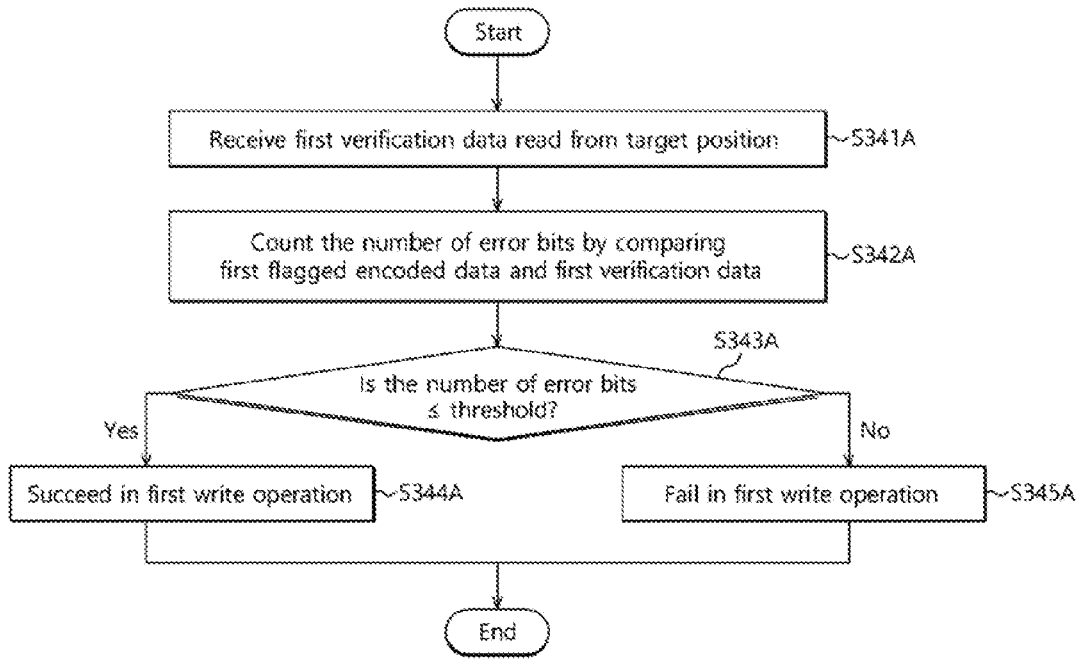
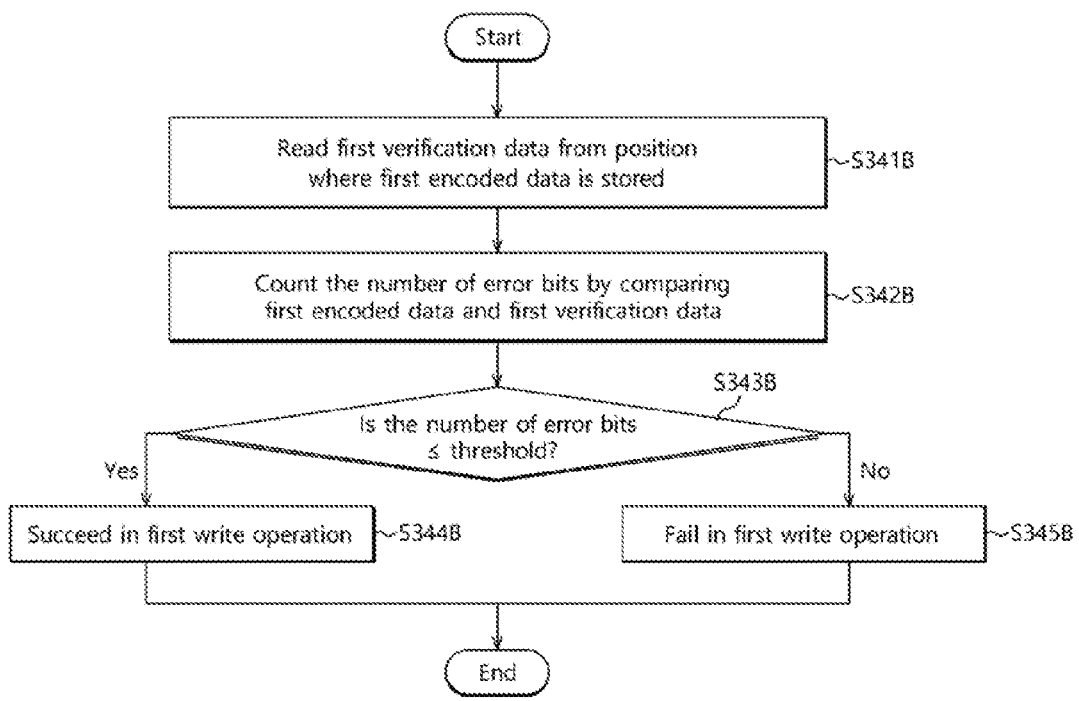

OPERATING METHOD OF DATA STORAGE DEVICE

CROSS-REFERENCES TO RELATED APPLICATION

The present application claims priority under 35 U.S.C. §119(a) to Korean application number 10-2016-0104405, flied on Aug. 17, 2016, in the Korean Intellectual Property Office, which is incorporated herein by reference in its entirety.

BACKGROUND

1. Technical Field

Various embodiments generally relate to a data storage device and, more particularly, to an operating method of a data storage device including a nonvolatile memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices may be embedded in an external device during manufacturing of the external devices or may be fabricated separately and then connected afterwards to an external device.

A data storage device may be prepared in the form of a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

SUMMARY

Various embodiments are directed to provide an operating method of a data storage device including a nonvolatile memory device, for decreasing the number of error bits within an error correction capability, using inverted data obtained by inverting original data to be stored in the nonvolatile memory device.

In an embodiment, a method for operating a data storage device may include: receiving first data; generating first flagged data by adding a first flag to the first data; generating first encoded flagged data by performing an encoding operation on the first flagged data; performing a first write operation for storing the first encoded flagged data in a target position of a phase change memory region; determining whether the first write operation succeeds or falls; generating second flagged data by adding a second flag to second data obtained by inverting the first data, when it is determined that the first write operation fails; generating second encoded flagged data by performing an encoding operation on the second flagged data; and performing a second write operation for storing the second encoded flagged data in the target position.

In an embodiment, a method for operating a data storage device may include: generating first encoded data by performing an encoding operation on first data; generating first flagged encoded data by adding a first flag to the first encoded data; performing a first write operation for storing the first flagged encoded data in a target position of a phase change memory region; determining whether the first write operation succeeds or falls; generating second flagged encoded data by adding a second flag to second encoded data obtained by inverting the first encoded data, when it is determined that the first write operation falls; and performing a second write operation for storing the second flagged encoded data in the target position.

BRIEF DESCRIPTION OF THE DRAWINGS

The above and other features and advantages of the present invention will become more apparent to those skilled in the art to which the present invention belongs by describing various embodiments thereof with reference to the attached drawings in which:

FIG. 2 is a diagram for explaining a case where the number of error bits is decreased by storing inverted data in stuck memory cells.

FIG. 5 is a diagram for explaining an operating method of the data storage device of FIG. 3 for reading and transferring first data.

FIGS. 11A and 11B are diagrams for explaining an operating method of the data storage device of FIG. 9 for reading and transferring first data.

FIG. 12 is a flow chart of an operating method of the data storage device of FIG. 9 for storing first data in response to a write request from an external device.

FIGS. 13A and 13B are flow charts of operating methods of a determination unit of FIG. 9 for determining whether a first write operation has succeeded.

DETAILED DESCRIPTION

Figure 1A:
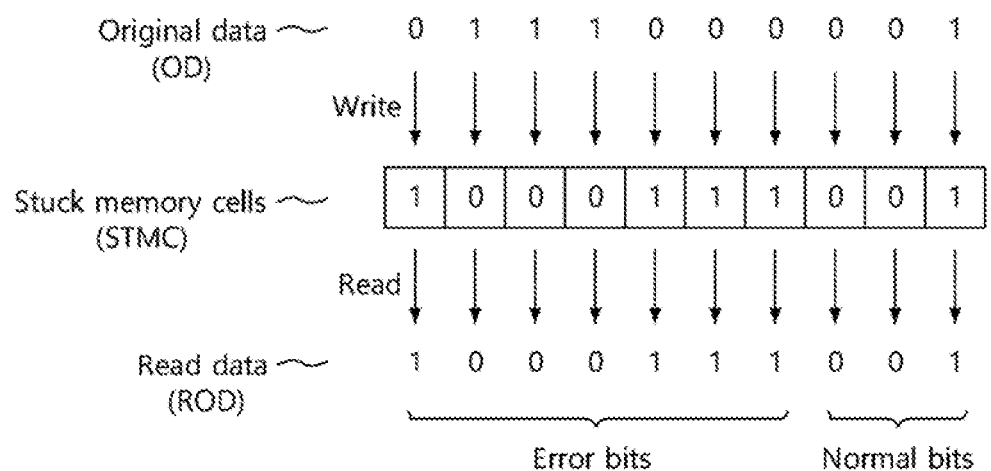
FIGS. 1A and 1B are diagrams for explaining a change in the number of error bits according to data to be stored, when phase change memory cells are stuck.

Hereinafter, a data storage device and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It is further noted that in the following detailed description, specific details are set forth for facilitating the understanding of the present invention, however, the present invention may be practiced without some of these specific details. Also, it is noted, that well-known structures and/or processes may have only been described briefly or not described at all to avoid obscuring the present disclosure with unnecessary well known details.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, various embodiments of the present invention will be described with reference to the attached drawings.

Figure 1B:
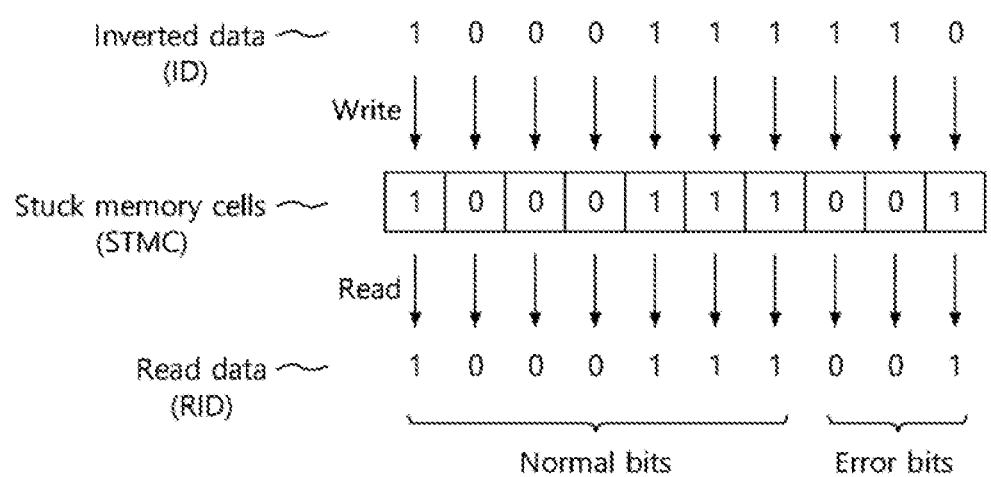

FIGS. 1A and 1B are diagrams for explaining a change in the number of error bits according to data to be stored, when phase change memory cells are stuck. FIG. 1A illustrates a case where original data OD is stored, and FIG. 1B illustrates a case where inverted data ID from the original data OD is stored.

Referring to FIG. 1A, for example, 10 memory cells STMC of a phase change memory device may be worn as they are used, and may be stuck in a state in which they store a "0" or a "1." If data ROD is read from the stuck memory cells STMC after the original data OD of 10 bits is stored in the stuck memory cells STMC, 7 stuck memory cells STMC in which stuck bits are different from original bits of the original data OD may cause error bits. 3 stuck memory cells STMC in which stuck bits are identical to original bits of the original data OD may output normal bits.

Referring to FIG. 1B, if the inverted data ID is stored in the same stuck memory cells STMC and data RID is read from the stuck memory cells STMC, three (3) stuck memory cells STMC in which stuck bits are different from inverted bits of the inverted data ID may cause error bits. Seven (7) stuck memory cells STMC in which stuck bits are identical to inverted bits of the inverted data ID may output normal bits.

That is, in a phase change memory device, depending on the number of error bits which occur as stuck bits are different from original bits, by storing inverted data instead of original data, the number of error bits may be decreased. Therefore, even a memory region which is not able to be used in storing original data due to stuck memory cells may be used in storing inverted data. As a result, the service life of the phase change memory device may be extended.

FIG. 2 is a diagram for explaining a case where the number of error bits is decreased by storing inverted data in stuck memory cells. A first table T1 shows the number of error bits when original data is written in 10 stuck memory cells, and a second table T2 shows the number of error bits when inverted data is written in the same stuck memory cells.

First, referring to the first table T1, when the original data is written in 10 stuck memory cells, the number of stuck memory cells in which stuck bits correspond to original bits may be any one among "0" to "10." Also, referring to the table T1, the number of stuck memory cells in which stuck bits do not correspond to original bits, that is, the number of error bits, may be "10" to "0."

For the cases in which the number of error bits are from "6" to "10" as indicated by shading, the Inverted data may be written in 10 stuck memory cells Instead of original data. In this case, referring to the second table T2, the number of stuck memory cells in which stuck bits correspond to inverted bits may be "10" to "6," and the number of error bits may be decreased to "0" to "4."

In summary, if original data is stored in "n" number of stuck memory cells, in the case where error bits the number of which is larger than "n/2" and smaller than or equal to "n" occur, by storing inverted data, it is possible to control only error bits the number of which is equal to or less than "n/2", to occur. In other words, even in the case where an error correction capability of a data storage device is exceeded when original data is stored, the data storage device may correct error bits within the error correction capability when inverted data is stored. As will be described later, in a data storage device in accordance with an embodiment, the number of error bits is checked after storing original data in a phase change memory region, and inverted data is stored again depending on the number of error bits. Consequently, the number of error bits may be decreased to be within an error correction capability, and the corresponding memory region may be used.

Figure 3:
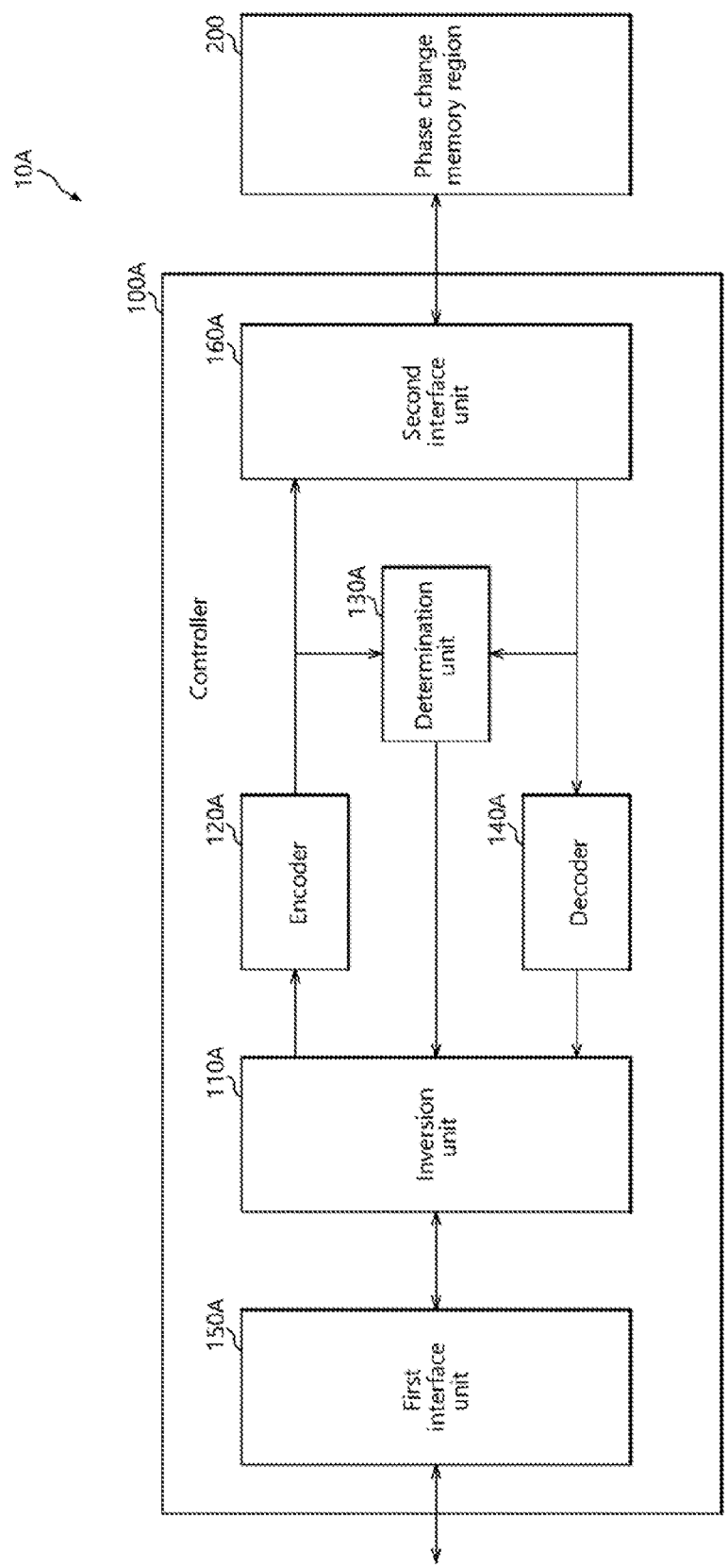
FIG. 3 is a block diagram illustrating a data storage device in accordance with an embodiment of the present invention.

FIG. 3 is a block diagram illustrating a data storage device 10A in accordance with an embodiment of the present invention.

The data storage device 10A may be configured for storing data provided from an external device (not shown), in response to a write request received from the external device. Also, the data storage device 10A may be configured to provide stored data to the external device, in response to a read request received from the external device.

The data storage device 10A may include a controller 100A operatively coupled to a phase change memory region 200.

The controller 100A may perform a first write operation for storing first data provided from the external device, at a target position of the phase change memory region 200. When the first write operation fails, the controller 100A may perform a second write operation for storing at the target position second data obtained by inverting the first data.

The controller 100A may include an inversion unit 110A, an encoder 120A, a determination unit 130A, a decoder 140A, and first and second interface units 150A and 160A.

The first interface unit 150A may provide an interface between the external device and the controller 110A. Any suitable first interface unit 150A may be employed. The first interface unit 150A may communicate with the external device, and may transmit control signals received from the external device to the internal units of the controller 100A. The first interface unit 150A may transmit data received from the external device to the inversion unit 110A, and transmit data received from the inversion unit 110A to the external device.

The inversion unit 110A may selectively invert the first data provided from the external device through the first interface unit 150A, into the second data, add a flag to the first data or the second data, and output the resultant data. The flag may indicate whether the first data is inverted or not. For example, the inversion unit 110A may add the flag of "0" when not inverting the first data, and add the flag of "1" when inverting the first data. For example, the inversion unit 110A may generate and output first flagged data by adding the flag of "0" to the first data for the first write operation. Further, the inversion unit 110A may invert the first data into the second data, and generate and output second flagged data by adding the flag of "1" to the second data for the second write operation, in response to a write failure report for the first write operation, which is transmitted from the determination unit 130A.

The inversion unit 110A may receive decoded read data and a decoded read flag which are read from the phase change memory region 200 according to a read request received from the external device. The decoded read data are read data received from the phase change memory region and which have been subjected to a decoding operation by the decoder 140A. The inversion unit 110A may obtain the first data by selectively inverting the decoded read data by referring to the decoded read flag, and output the first data to the first interface unit 150A.

The encoder 120A may generate and output first encoded flagged data by performing an encoding operation on the first flagged data received from the inversion unit 110A, according to an error correction code. The first encoded flagged data may include first parity data which is generated for the first flagged data. The first encoded flagged data may be stored at the target position of the phase change memory region 200 through the first write operation. The first encoded flagged data may be transmitted to the determination unit 130A for determining whether the first write operation has succeeded or failed.

When the first write operation has failed, the encoder 120A may perform an encoding operation on the second flagged data received from the inversion unit 110A, and generate second encoded flagged data. The second encoded flagged data may include second parity data which is generated for the second flagged data. The second encoded flagged data may be stored at the same target position of the phase change memory region 200 through the second write operation. The second encoded flagged data may be transmitted to the determination unit 130A for determining whether the second write operation has succeeded or failed.

The determination unit 130A may determine whether the first write operation has succeeded or failed, after the first write operation is performed. For example, the determination unit 130A may count the number of error bits by comparing the first encoded flagged data with first verification data read from the target position, and determine that the first write operation has succeeded when the number of error bits is equal to or less than a threshold. The determination unit 130A may determine that the first write operation has failed when the number of error bits is greater than the threshold, and transmit the write failure report to the inversion unit 110A.

The threshold of the determination unit 130A may be set in consideration of the error correction capability of the decoder 140A. For example, when the decoder 140A may correct a maximum number of "t" error bits, the threshold may be set to a value equal to or less than the maximum number "t."

The determination unit 130A may determine whether the second write operation has succeeded or failed, after the second write operation is performed. For example, the determination unit 130A may count the number or error bits by comparing the second encoded flagged data with second verification data read from the target position, and determine that the second write operation has succeeded when the number of error bits is equal to or less than the threshold. The determination unit 130A may determine that the second write operation has failed when the number of error bits is greater than the threshold. In this case, the target position may be set as a bad region, and a write failure may be reported to the external device.

The decoder 140A may perform the decoding operation according to an error correction code, on target read data read from the target position of the phase change memory region 200, in response to a read request received from the external device. The target read data may include read data, a read flag and read parity data. The decoder 140A may correct error bits of the read data and the read flag based on the read parity data, and generate the decoded read data and the decoded read flag. When the decoding operation succeeds, the decoder 140A may provide the decoded read data and the decoded read flag to the inversion unit 110A.

The second interface unit 160A may provide an interface between the controller 100A and the phase change memory region 200. Any suitable second interface unit 160A may be employed. The second interface unit 160A may communicate with the phase change memory region 200, and transmit commands generated by the controller 100A, to the phase change memory region 200. The commands may for example include at least one of a read and a write command corresponding to respective read and write requests received from the external device. The second interface unit 160A may transmit data received from the encoder 120A to the phase change memory region 200. The second interface unit 160A may also transmit data received from the phase change memory region 200 to the decoder 140A.

The phase change memory region 200 may store data received from the controller 100A. The phase change memory region 200 may read stored data and transmit the read data to the controller 100A, according to control of the controller 100A. The phase change memory region 200 may include at least one phase change memory device.

According to an embodiment, the data storage device 10A may, in addition to at least one phase change memory device, further include another type of nonvolatile memory device such as, for example, a flash memory, a Ferroelectrics Random Access Memory (FeRAM), a Magnetoresistive Random Access Memory (MRAM), a Resistive Random Access Memory (ReRAM), and the like. The flash memory may be a NAND flash or a NOR flash. The phase change memory region 200 may be used for storing data in cooperation with another type of nonvolatile memory device. The phase change memory region 200 may be used as a cache memory, a buffer memory or a working memory for another type of nonvolatile memory device. In an embodiment, the data storage device 10A may include at least one phase change memory device and a flash memory wherein the phase change memory device serves as a cache memory, a buffer memory or a working memory for the flash memory. In yet another embodiment, the data storage device 10A may include at least one phase change memory device and a NAND flash memory wherein the phase change memory device serves as a cache memory, a buffer memory or a working memory for the NAND flash memory.

Figure 4A:
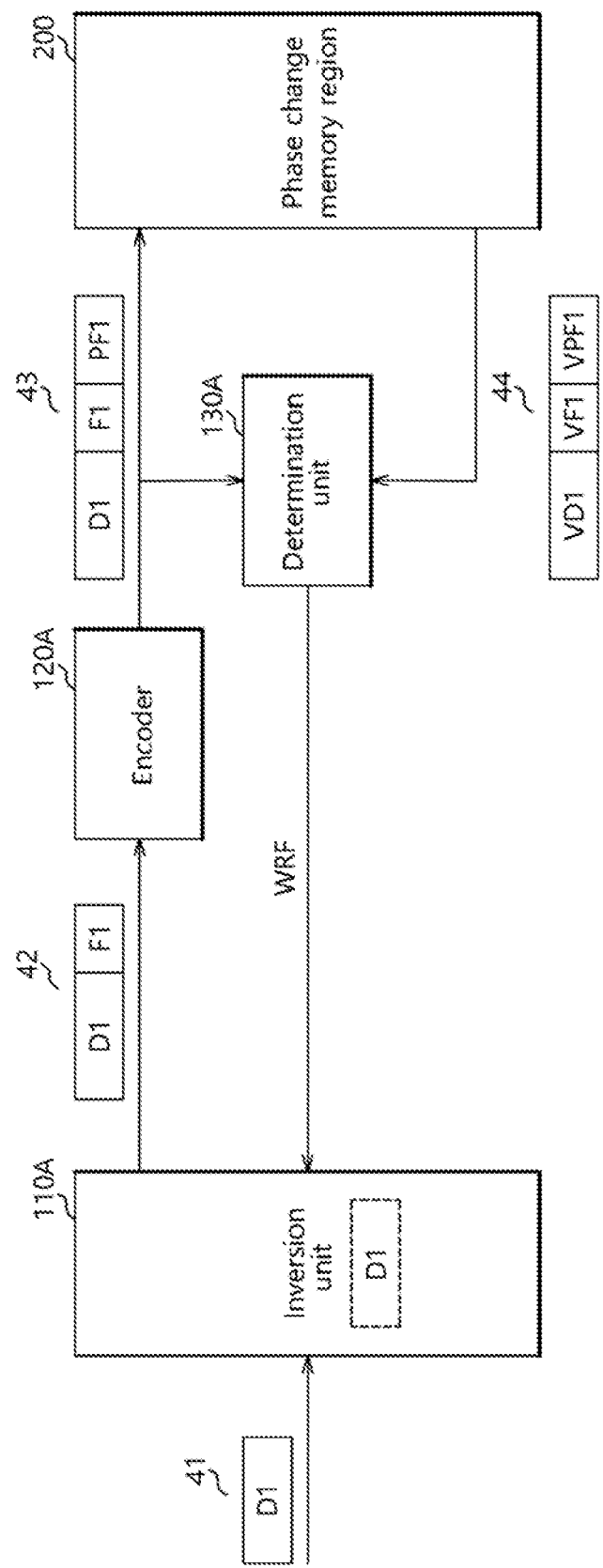
FIGS. 4A and 4B are diagrams for explaining an operating method of the data storage device of FIG. 3 for storing first data transmitted from an external device.
Figure 4B:
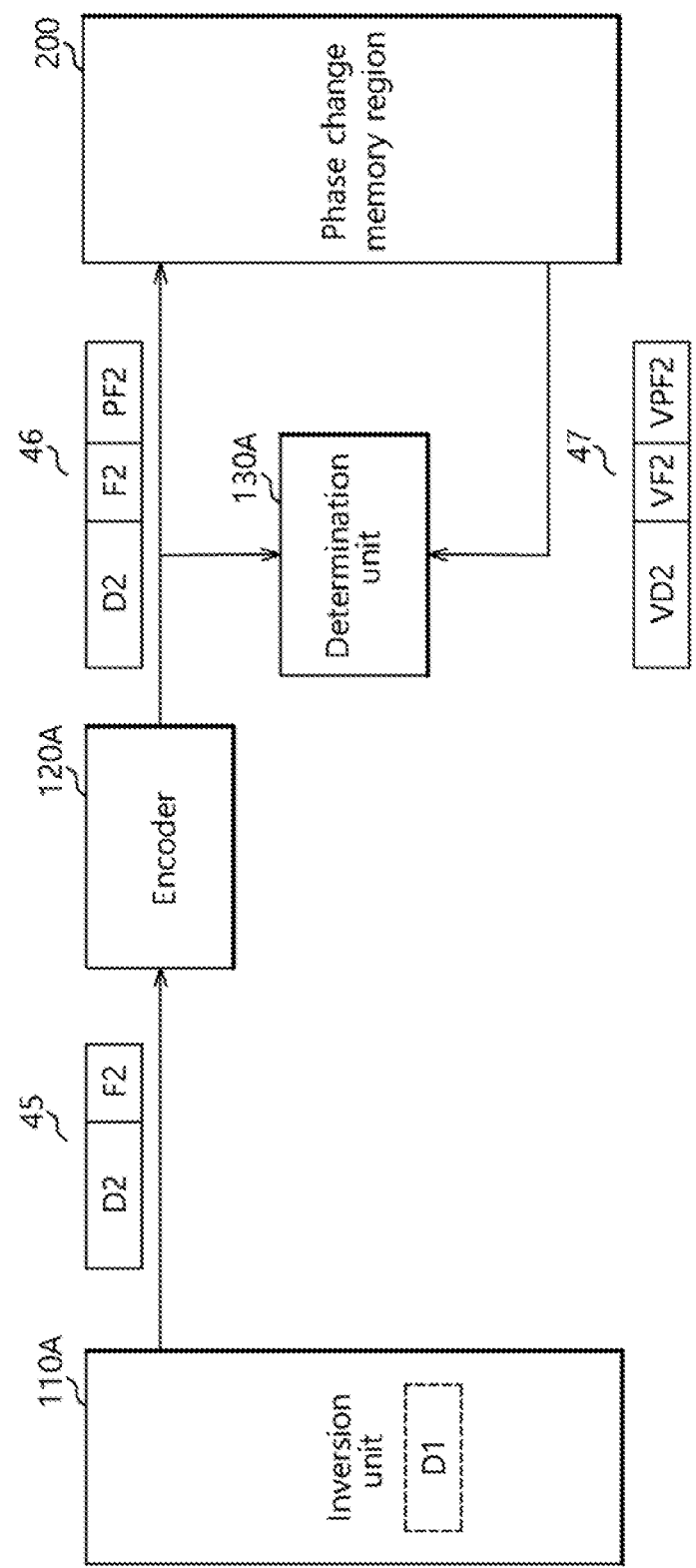

FIGS. 4A and 4B are diagrams for explaining an operating method of the data storage device 10A of FIG. 3 for storing first data D1 transmitted from an external device. For example, FIG. 4A shows a method of performing a first write operation on first data D1, and FIG. 4B shows a method of performing a second write operation on second data D2 which are obtained by inverting the first data D1, after the first write operation fails.

Referring to FIG. 4A, the inversion unit 110A may receive the first data D1 41. The inversion unit 110A may generate and output first flagged data 42 by adding a first flag F1 to the first data D1. The first flag may be, for example, a "0," or a "1." For the rest of the description of the embodiment for FIG. 4A, let us assume for simplifying the description that the first flag is a "0." The inversion unit 110A may store the first data D1 against the failure of the first write operation.

The encoder 120A may generate first parity data PF1 by performing an encoding operation on the first flagged data 42, and generate and output of a first encoded flagged data 43 by adding the first parity data PF1 to the first flagged data 42. The first encoded flagged data 43 may be stored at a target position of the phase change memory region 200 through the first write operation.

The controller 100A may read the data stored at the target position, as first verification data 44, for determining whether the first write operation has succeeded or failed. The first verification data 44 may include first read data VD1, a first read flag VF1 and first read parity data VPF1.

The determination unit 130A may count the number of error bits by comparing the first encoded flagged data 43 with the first verification data 44, and determine whether the number of error bits is equal to or less than a threshold. The determination unit 130A may determine that the first write operation has succeeded when the number of error bits is equal to or less than the threshold. The determination unit 130A may determine that the first write operation has failed when the number of error bits is greater than the threshold, and transmit a write failure report WRF to the inversion unit 110A.

Referring to FIG. 4B, the inversion unit 110A may generate the second data D2 by inverting the first data D1 in response to the write failure report WRF received from the determination unit 130A. The inversion unit 110A may generate and output second flagged data 45 by adding a second flag F2 of, for example, "1," to the second data D2.

The encoder 120A may generate second parity data PF2 by performing an encoding operation on the second flagged data 45, and generate and output second encoded flagged data 46 by adding the second parity data PF2 to the second flagged data 45. The second encoded flagged data 46 may be stored at the target position of the phase change memory region 200 through the second write operation.

The controller 100A may read the data stored at the target position, as second verification data 47, for determining whether the second write operation has succeeded or failed. The second verification data 47 may include second read data VD2, a second read flag VF2 and second read parity data VPF2.

The determination unit 130A may count the number of error bits by comparing the second encoded flagged data 46 with the second verification data 47, and determine whether the number of error bits is equal to or less than the threshold. The determination unit 130A may determine that the second write operation has succeeded when the number of error bits is equal to or less than the threshold. The determination unit 130A may determine that the second write operation has failed when the number of error bits is greater than the threshold.

The controller 100A may set the target position as a bad region when it is determined that the second write operation has failed. The controller 100A may report a write failure to the external device. The controller 100A may repeat first and second write operations according to the above-described method for storing the first data D1 at a different position of the phase change memory region 200, according to control of the external device.

FIG. 5 is a diagram for explaining an operating method of the data storage device 10A of FIG. 3 for reading and transferring first data D1.

Referring to FIG. 5, the controller 100A may read data stored at the target position of the phase change memory region 200, as target read data 51, in response to a read request received from the external device for the first data D1. The target read data 51 may include read data D, a read flag F and read parity data PF.

The decoder 140A may generate and output decoded data 52 by performing a decoding operation on the target read data 51. For example, the decoder 140A may correct the error bits included in the read data D and the read flag F based on the read parity data PF, and generate decoded read data DD and a decoded read flag DF as the decoded data 52.

The inversion unit 110A may receive the decoded data 52 including the decoded read data DD and the decoded read flag DF, and selectively invert the decoded read data DD by referring to the decoded read flag DF. The inversion unit 110A may obtain the decoded read data DD as the first data D1 when the decoded read flag DF is, for example, "0." The inversion unit 110A may obtain the first data D1 by inverting the decoded read data DD when the decoded read flag DF is, for example, "1." The controller 100A may output obtained first data D1 53 to the external device.

Figure 6:
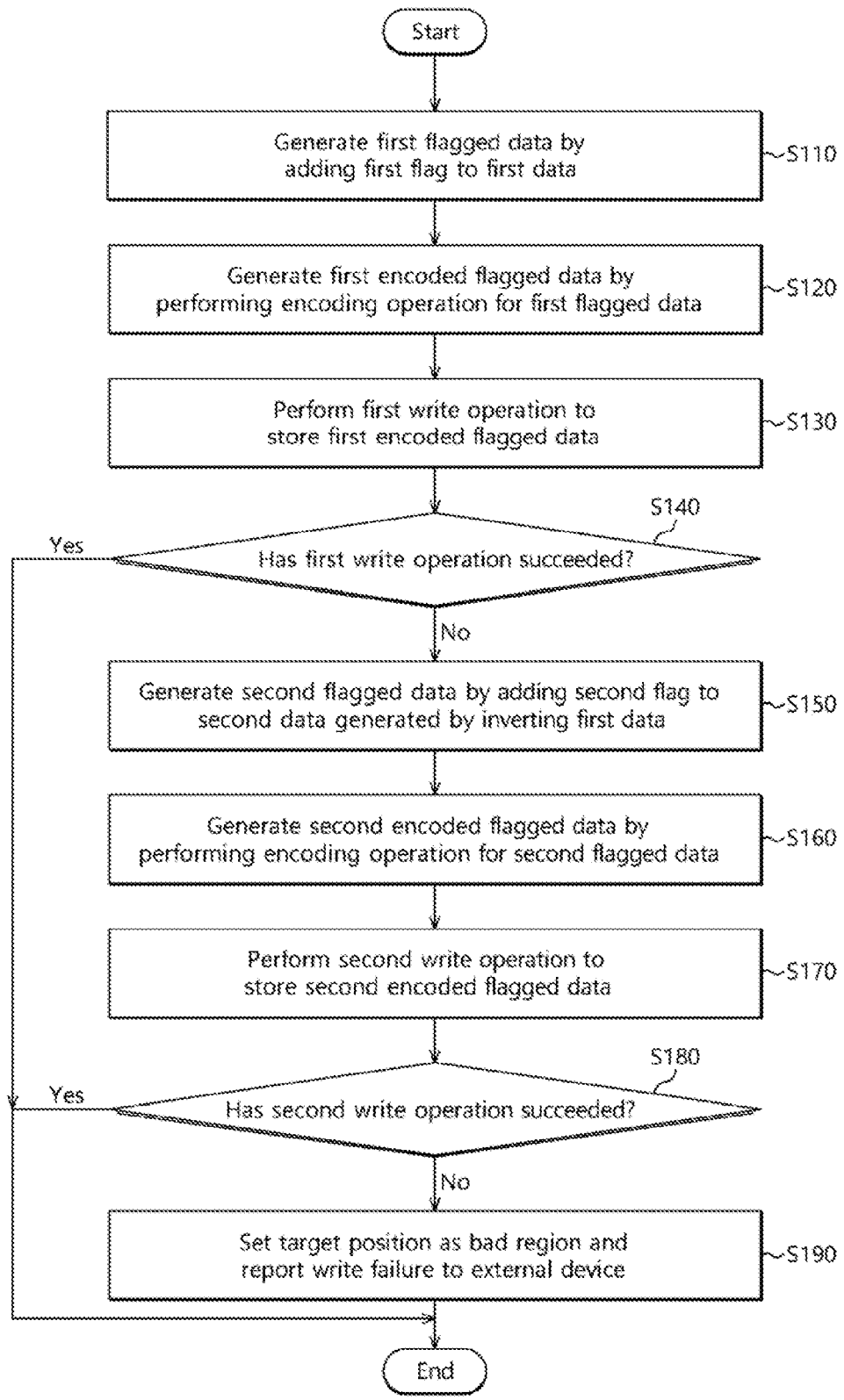
FIG. 6 is a flow chart of an operating method of the data storage device of FIG. 3 for storing first data in response to a write request from an external device.

FIG. 6 is a flow chart of an operating method of the data storage device 10A of FIG. 3 for storing first data in response to a write request from an external device.

At step S110, the method may generate first flagged data by adding a first flag to first data received from an external device. For example, the inversion unit 110A of the controller 100A of the data storage device 10A may generate first flagged data by adding a first flag to first data received from the external device.

At step S120, the method may further generate first encoded flagged data by performing an encoding operation for the first flagged data obtained by step S110. For example, the encoder 120A of the controller 100A of the data storage device 10A may generate first encoded flagged data by performing an encoding operation on the first flagged data which were generated by the inversion unit 110A in step S110 and were transmitted to the encoder 120A.

At step S130, the method may further perform a first write operation for storing the first encoded flagged data at a target position of the phase change memory region 200. For example, the controller 100A may perform a first write operation for storing the first encoded flagged data at a target position of the phase change memory region 200.

At step S140, the method may further determine whether the first write operation of step S130 has succeeded. For example, at step 140 the determination unit 130A of the controller 100A may determine whether the first write operation has succeeded. When it is determined that the first write operation has succeeded, the process may be ended. When it is determined that the first write operation has failed, the process may proceed to step S150. The determination of whether the first write operation has succeeded may be performed using any suitable error detection method and comparing the number of detected errors to a threshold error number.

At step S150, the method may further generate second flagged data by adding a second flag to second data obtained by inverting the first data. For example, at step S150, the inversion unit 110A may generate second flagged data by adding a second flag to second data obtained by inverting the first data.

At step S160, the method may generate second encoded flagged data by performing an encoding operation on the second flagged data. For example, the encoder 120A may generate second encoded flagged data by performing an encoding operation on the second flagged data generated at step S150.

At step S170, the method may perform a second write operation for storing the second encoded flagged data at the target position. For example, at step S170, the controller 100A may perform a second write operation for storing the second encoded flagged data at the target position.

At step S180, the method may determine whether the second write operation has succeeded of failed. For example, at step S180, the determination unit 130A may determine whether the second write operation has succeeded of failed. When it is determined that the second write operation has succeeded, the process may be ended. When it is determined that the second write operation has failed, the process may proceed to step S190.

At step S190, the method may further include setting the target position as a bad region, and reporting a write failure to the external device. For example, at step S190, the controller 100A may set the target position as a bad region, and report a write failure to the external device.

Figure 7:
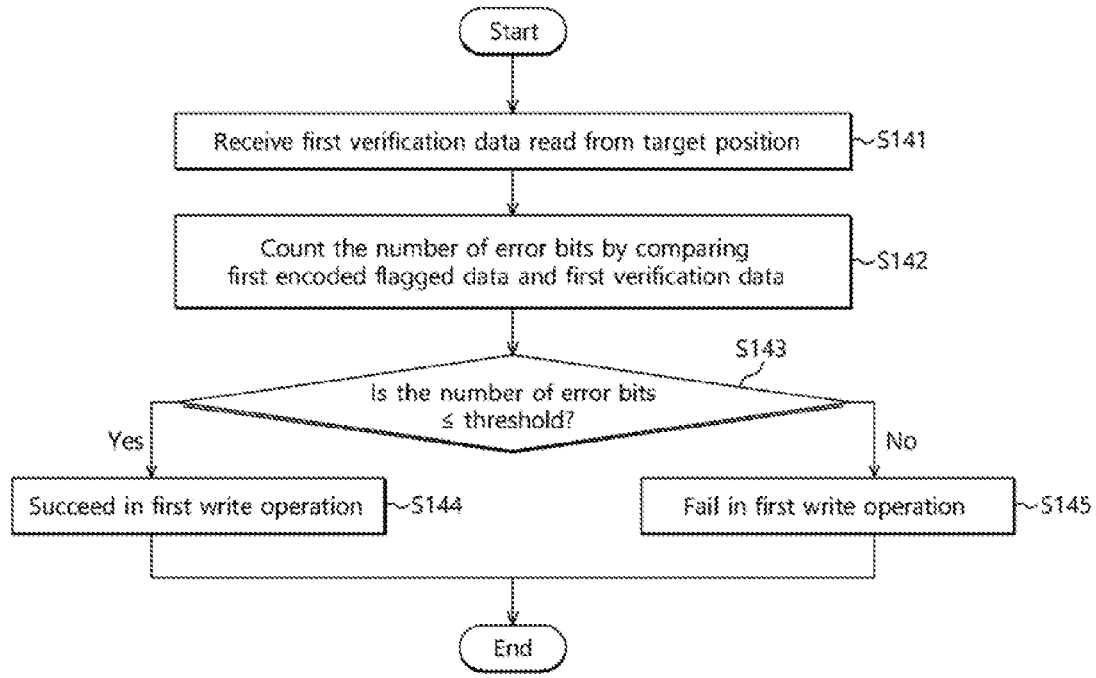
FIG. 7 is a flow chart of an operating method of a determination unit of FIG. 3 for determining whether a first write operation has succeeded.

FIG. 7 is a flow chart of an operating method of the determination unit 130A of FIG. 3 for determining whether a first write operation has succeeded. Steps shown in FIG. 7 may represent a detailed embodiment of the step S140 of FIG. 6.

At step S141, the determining step S140 of FIG. 6, may further include receiving first verification data read from the target position. The first verification data may include first read data, a first read flag and first read parity data. For example, step 141 may include the determination unit 130A receiving first verification data read from the target position. The first verification data may include first read data, a first read flag and first read parity data.

At step S142, the method further includes counting the number of error bits by comparing the first encoded flagged data with the first verification data. For example, at step S142, the determination unit 130A may count the number of error bits by comparing the first encoded flagged data with the first verification data.

At step S143, the determination unit 130A may determine whether the number of error bit is equal to or less than a threshold. When the number of error bits is equal to or less than the threshold, the process may proceed to step S144. When the number of error bits is greater than the threshold, the process may proceed to step S145.

At step S144, the determination unit 130A may determine that the first write operation has succeeded.

At step S145, the determination unit 130A may determine that the first write operation has failed.

Meanwhile, at step of S180 of FIG. 6, a method of the determination unit 130A for determining whether the second write operation has succeeded may be substantially the same as the method shown in FIG. 7.

Figure 8:
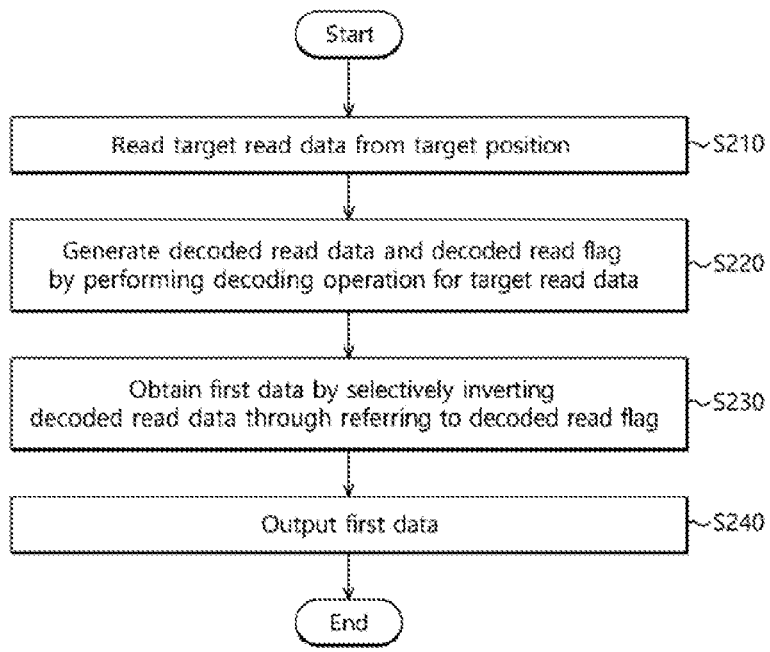
FIG. 8 is a flow chart of an operating method of the data storage device of FIG. 3 for reading and transferring first data in response to a read request from an external device.

FIG. 8 is a flow chart of an operating method of the data storage device 10A of FIG. 3 for reading and transferring first data in response to a read request from an external device.

At step S210, the controller 100A may read target read data from the target position of the phase change memory region 200. The target read data may include read data, a read flag and read parity data.

At step S220, the decoder 140A may generate decoded data by performing a decoding operation on the target read data. The decoder 140A may correct the error bits included in the read data and read flag based on the read parity data, and generate decoded read data and a decoded read flag as the decoded data.

At step S230, the inversion unit 110A may obtain first data by selectively inverting the decoded read data by referring to the decoded read flag.

At step S240, the controller 100A may output the first data to the external device.

Figure 9:
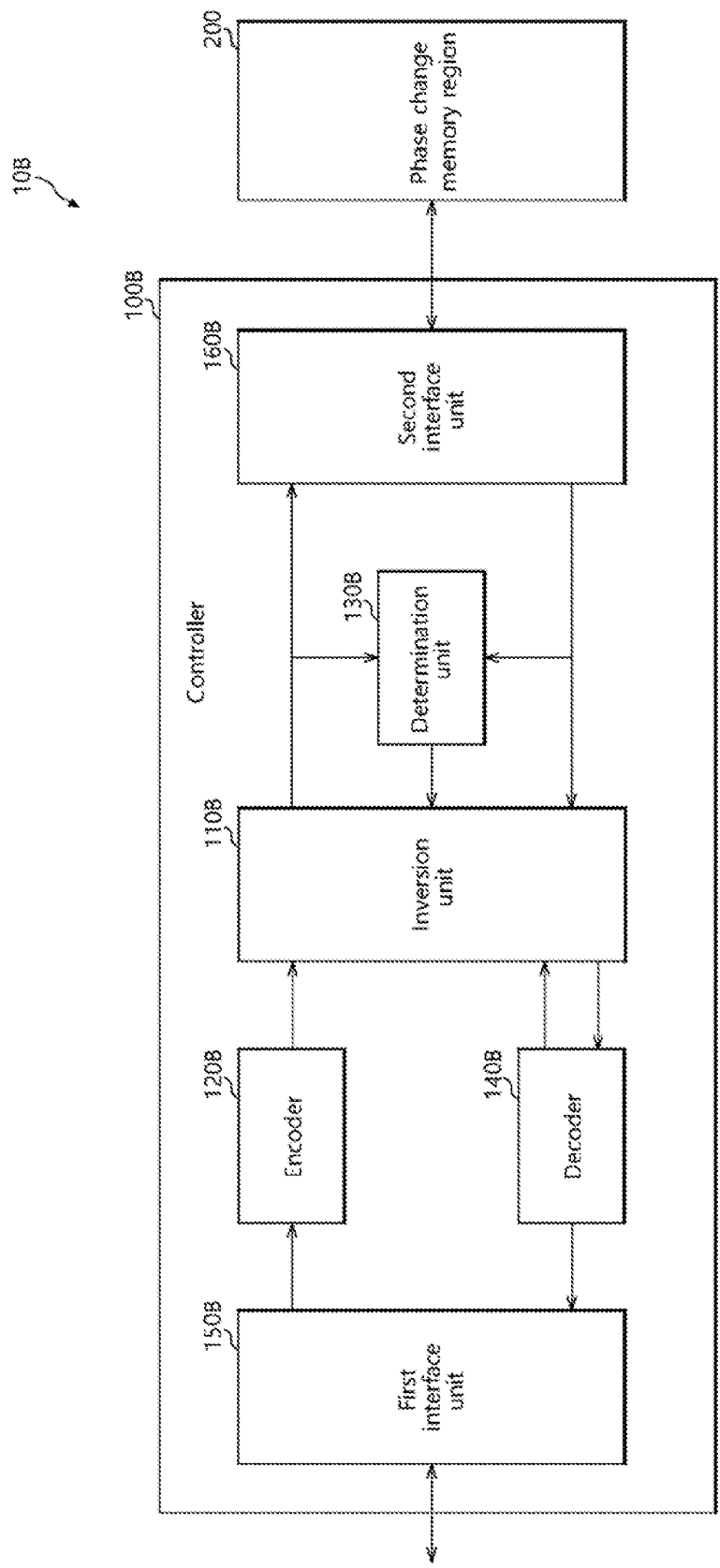
FIG. 9 is a block diagram illustrating a data storage device in accordance with an embodiment of the present invention.

FIG. 9 is a block diagram illustrating a data storage device 10B in accordance with another embodiment of the present invention.

The data storage device 10B may include a controller 100B operatively coupled to a phase change memory region 200.

The controller 100B may perform a first write operation for storing first data transmitted from an external device (not shown), at a target position of the phase change memory region 200. The controller 100B may perform, when the first write operation falls, a second write operation for storing second data obtained by inverting the first data, at the target position. However, unlike the controller 100A of FIG. 3, the controller 100B may perform the second write operation by inverting first parity data for the first data with inverting the first data.

The controller 100B may include an inversion unit 110B, an encoder 120B, a determination unit 130B, a decoder 140B, and first and second interface units 150B and 160B. The first and second interface units 150B and 160B may be configured in substantially the same manner as the first and second interface units 150A and 160A of FIG. 3.

The encoder 120B may generate and output first encoded data by performing an encoding operation on the first data transmitted from the external device through the first interface unit 150B. The first encoded data may include first parity data which is generated for the first data.

The inversion unit 110B may selectively invert the first encoded data outputted from the encoder 120B, into second encoded data, add a flag to the first encoded data or the second encoded data, and output resultant data. The flag may Indicate whether the first encoded data is inverted or not. For example, the inversion unit 110B may add the flag of a plurality of bits respectively having the same first value, for example, "000," when not inverting the first encoded data. The inversion unit 110B may add the flag of a plurality of bits respectively having the same second value, for example, "111," when inverting the first encoded data. As will be described later, by setting a flag having a plurality of bits, it is possible to correct an error bit which occurs in the flag.

For example, the inversion unit 110B may generate and output first flagged encoded data by adding the flag of "000" to the first encoded data for the first write operation. The first flagged encoded data may be stored at the target position of the phase change memory region 200 through the first write operation.

Further, the inversion unit 110B may generate second encoded data by inverting the first encoded data, for the second write operation, in response to a write failure report for the first write operation, which is transmitted from the determination unit 130B. The inversion unit 110B may generate and output second flagged encoded data by adding the flag of "111" to the second encoded data. The second flagged encoded data may be stored at the target position of the phase change memory region 200 through the second write operation.

The inversion unit 110B may receive target read data read from the target position of the phase change memory region 200, in response to a read request received from the external device. The target read data may include read data, read parity data and a read flag. The inversion unit 110B may generate third data and third parity data by selectively inverting the read data and the read parity data by referring to the read flag, and output the third data and the third parity data to the decoder 140B.

The inversion unit 110B may generate a decoded read flag by performing a decoding operation on the read flag based on a hamming distance. The inversion unit 110B may generate third data and third parity data by selectively inverting the read data and the read parity data by referring to the decoded read flag, and output the third data and the third parity data to the decoder 140B. That is, the inversion unit 110B may correct the read flag which is set by the plurality of bits, even though an error bit occurs in the read flag.

The inversion unit 110B may generate fourth data and fourth parity data by inverting the third data and the third parity data, in response to a decoding failure report from the decoder 140B, and output the fourth data and the fourth parity data to the decoder 140B. In other words, in consideration of a case where the third data and the third parity data are erroneously generated by the read flag which is generally erroneous, a decoding operation may be repeatedly performed for the fourth data and the fourth parity data.

The determination unit 130B may determine whether the first write operation has succeeded or failed, after the first write operation is performed. For example, the determination unit 130B may count the number of error bits by comparing the first flagged encoded data with first verification data read from the target position, and determine that the first write operation has succeeded when the number of error bits is equal to or less than a threshold. The determination unit 130B may determine that the first write operation has failed when the number of error bits is greater than the threshold, and transmit a write failure report to the inversion unit 110B.

The threshold of the determination unit 130B may be set in consideration of the error correction capability of the decoder 140B. For example, when the decoder 140B may correct a maximum number of "t" error bits, the threshold may be set to a value equal to or less than the maximum number "t."

According to an embodiment, the determination unit 130B may determine whether the first write operation has succeeded or failed, for only the first encoded data. In this case, data read from a portion of the target position, where the first encoded data is stored, may become first verification data. The determination unit 130B may compare the first verification data read from the portion of the target position, where the first encoded data is stored, with the first encoded data, and determine whether the number of error bits is equal to or less than the threshold. For example, since a flag portion stored at the target position is not inputted to the decoder 140B, the determination unit 130B may determine whether the number of error bits is equal to or less than the threshold, for only a portion on which a decoding operation is to be performed.

The determination unit 130B may determine whether the second write operation has succeeded or failed after the second write operation is performed. For example, the determination unit 130B may count the number of error bits by comparing the second flagged encoded data with second verification data read from the target position, and determine that the second write operation has succeeded when the number of error bits is equal to or less than the threshold. The determination unit 130B may determine that the second write operation has failed when the number of error bits is greater than the threshold. In this case, the target position may be set as a bad region, and a write failure may be reported to the external device.

According to an embodiment, the determination unit 130B may determine whether the second write operation has succeeded or failed, for only the second encoded data. In this case, data read from a portion of the target position, where the second encoded data is stored, may become second verification data. The determination unit 130B may compare the second verification data read from the portion of the target position, where the second encoded data is stored, with the second encoded data, and determine whether the number of error bits is equal to or less than the threshold.

The decoder 140B may perform a first decoding operation on data including the third data and the third parity data, which are read from the target position of the phase change memory region 200 and are selectively inverted by the inversion unit 110B, according to a read request received from the external device. The decoder 140B may correct error bits of the third data based on the third parity data. When the first decoding operation has succeeded, the decoder 140B may obtain first data and transmit the first data to the first interface unit 150B. However, when the first decoding operation has failed, the decoder 140B may transmit the decoding failure report to the inversion unit 110B.

After transmitting the decoding failure report, the decoder 140B may perform a second decoding operation on data including the fourth data and the fourth parity data, which are inverted by the inversion unit 110B. The decoder 140B may correct error bits of the fourth data based on the fourth parity data. When the second decoding operation has succeeded, the decoder 140B may obtain first data and transmit the first data to the first interface unit 150B. However, when the second decoding operation has failed, the controller 100B may report a decoding failure to the external device.

Figure 10A:
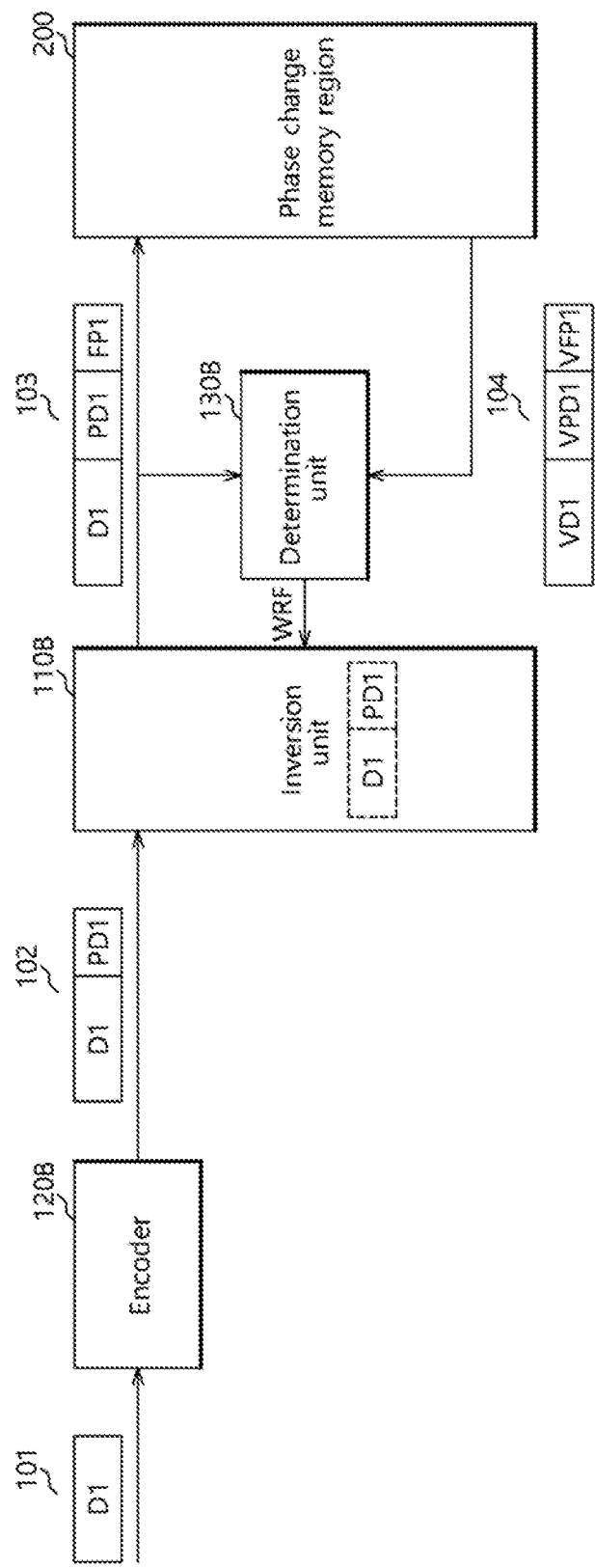
FIGS. 10A and 10B are diagrams for explaining an operating method of the data storage device of FIG. 9 for storing first data transmitted from an external device.
Figure 10B:
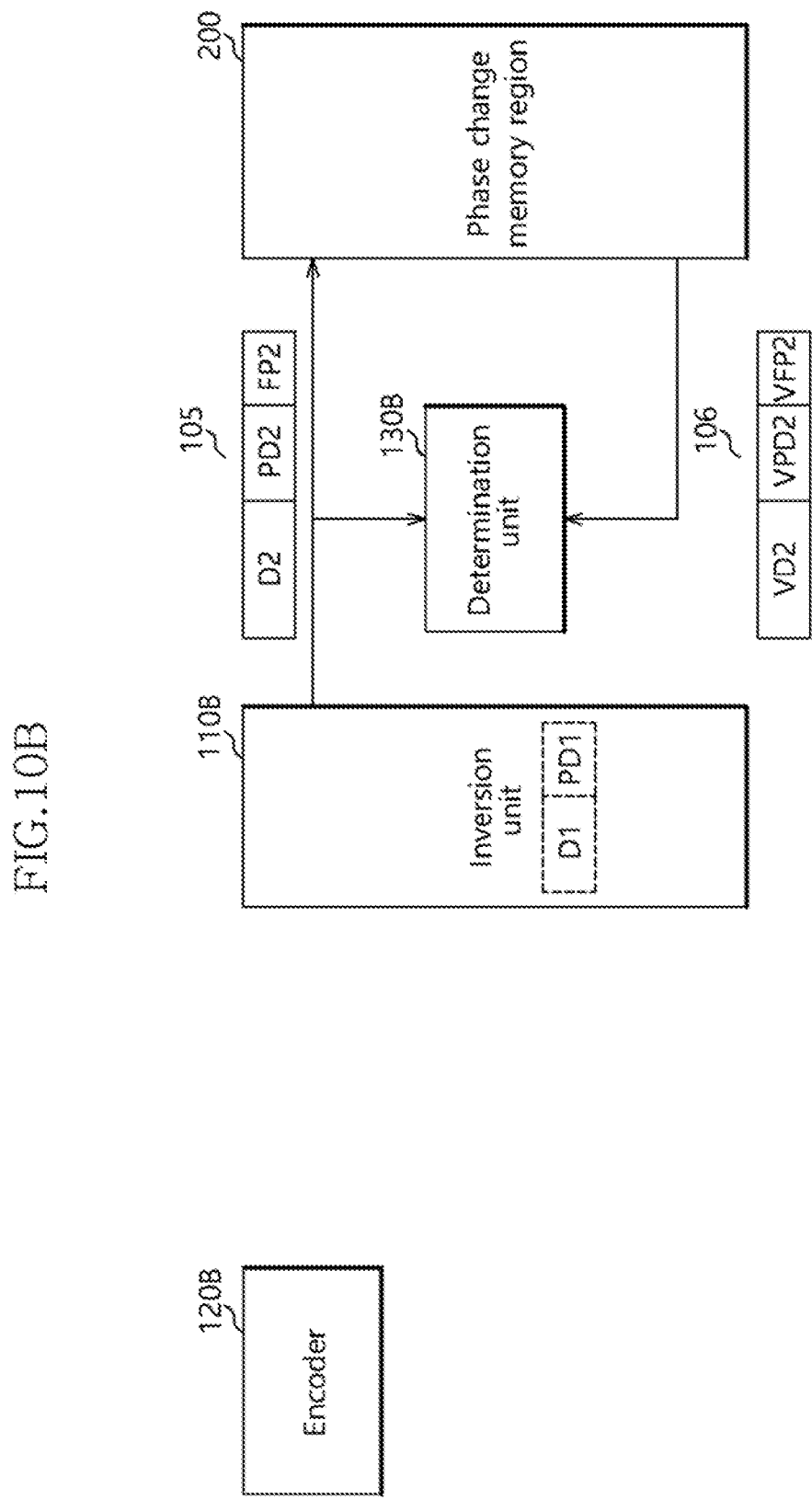

FIGS. 10A and 10B are diagrams for explaining an operating method of the data storage device 10B of FIG. 9 for storing first data D1 transmitted from an external device. For example, FIG. 10A shows a method of performing the first write operation, and FIG. 10B shows a method of performing the second write operation after the first write operation fails.

Referring to FIG. 10A, the encoder 120B may receive first data D1 101. The encoder 120B may generate first parity data PD1 by encoding the first data D1, and generate and output first encoded data 102 by adding the first parity data PD1 to the first data D1.

The inversion unit 110B may receive the first encoded data 102. The inversion unit 110B may generate and output first flagged encoded data 103 by adding a first flag FP1 of, for example, "000," to the first encoded data 102. The first flagged encoded data 103 may be stored at a target position of the phase change memory region 200 through the first write operation. The inversion unit 110B may store the first encoded data 102 against the failure of the first write operation.

The controller 100B may read the data stored at the target position, as first verification data 104, for determining whether the first write operation has succeeded or failed. The first verification data 104 may include first read data VD1, first read parity data VPD1 and a first read flag VFP1.

The determination unit 130B may count the number of error bits by comparing the first flagged encoded data 103 with the first verification data 104, and determine whether the number of error bits is equal to or less than a threshold. The determination unit 130B may determine that the first write operation has succeeded when the number of error bits is equal to or less than the threshold. The determination unit 130B may determine that the first write operation has failed when the number of error bits is greater than the threshold, and transmit a write failure report WRF to the inversion unit 110B.

According to an embodiment, the determination unit 130B may determine whether the number of error bits is equal to or less than a threshold, by comparing only the first data D1 and the first parity data PD1 of the first flagged encoded data 103 with the first read data VD1 and the first read parity data VPD1 of the first verification data 104. That is, because the first read flag VFP1 of the first verification data 104 is not Inputted to the decoder 140B, the determination unit 130B may determine that the first write operation has succeeded when the number of error bits for only the first read data VD1 and the first read parity data VPD1 on which a decoding operation is to be performed is equal to or less than the threshold.

Referring to FIG. 10B, the inversion unit 110B may generate second encoded data D2 and PD2 by inverting the first encoded data, that is, the first data D1 and the first parity data PD1, in response to the write failure report WRF. The inversion unit 110B may generate and output second flagged encoded data 105 by adding a second flag FP2 of, for example, "111," to the second encoded data D2 and PD2. The second flagged encoded data 105 may be stored at the target position of the phase change memory region 200 through the second write operation.

The controller 100B may read the data stored at the target position, as second verification data 106, for determining whether the second write operation has succeeded or failed. The second verification data 106 may include second read data VD2, second read parity data VPD2 and a second read flag VFP2.

The determination unit 130B may count the number of error bits by comparing the second flagged encoded data 105 with the second verification data 106, and determine whether the number of error bits is equal to or less than the threshold. The determination unit 130B may determine that the second write operation has succeeded when the number of error bits is equal to or less than the threshold. The determination unit 130B may determine that the second write operation has failed when the number of error bits is greater than the threshold.

According to an embodiment, the determination unit 130B may determine whether the number of error bits is equal to or less than the threshold, by comparing only the second encoded data D2 and PD2 of the second flagged encoded data 105 with the second read data VD2 and the second read parity data VPD2 of the second verification data 106. That is, because the second read flag VFP2 of the second verification data 106 is not inputted to the decoder 140B, the determination unit 130B may determine that the second write operation has succeeded when the number of error bits for only the second read data VD2 and the second read parity data VPD2 on which a decoding operation is to be performed is equal to or less than the threshold.

The controller 100B may set the target position as a bad region when it is determined that the second write operation has failed. The controller 100B may report a write failure to the external device. The controller 100B may repeat first and second write operations according to the above-described method for storing the first data D1 at a different position of the phase change memory region 200, according to control of the external device.

Figure 11A:
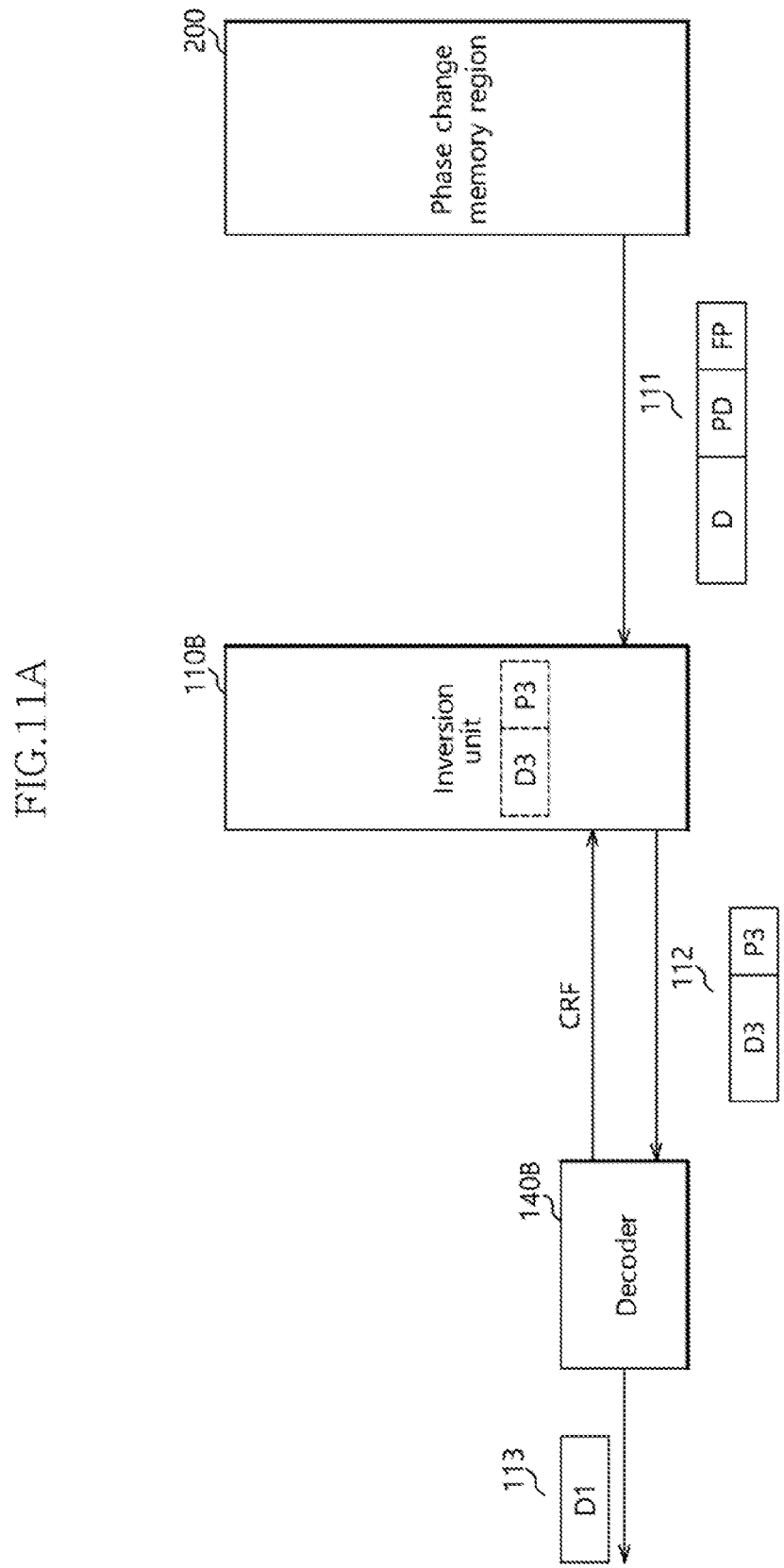

FIGS. 11A and 11B are diagrams for explaining an operating method of the data storage device 10B of FIG. 9 for reading and transferring first data D1.

Referring to FIG. 11A, the controller 100B may read the data stored at the target position of the phase change memory region 200, as target read data 111, in response to a read request received from the external device for the first data D1. The target read data 111 may include read data D, read parity data PD and a read flag FP.

The inversion unit 110B may receive the target read data 111. The inversion unit 110B may generate and output data 112 including third data D3 and third parity data P3 by selectively inverting the read data D and the read parity data PD by referring to the read flag FP. The inversion unit 110B may output the third data D3 and the third parity data P3 without inverting the read data D and the read parity data PD when the read flag FP is, for example, "000." The inversion unit 110B may output the third data D3 and the third parity data P3 by inverting the read data D and the read parity data PD when the read flag FP is, for example, "111." The inversion unit 110B may store the third data D3 and the third parity data P3 against the failure of the first decoding operation by the decoder 140B.

According to an embodiment, the inversion unit 110B may perform a decoding operation on the read flag FP, based on a hamming distance, and generate the data 112 based on a decoded read flag. In other words, since each of the first flag FP1 of FIG. 10A and the second flag FP2 of FIG. 10B is constructed by a plurality of bits respectively having the same value, recovery may be made based on the hamming distance of a small value. For example, in the case where the first flag FP1 of "000" is originally stored at the target position in FIG. 10A and the read flag FP of "010" is read from the target position in FIG. 11A, the inversion unit 110B may recover the read flag FP to "000" and generate the data 112 based on the recovered read flag. For another example, in the case where the second flag FP2 of "111" is originally stored at the target position in FIG. 10B, and the read flag FP of "110" Is read from the target position in FIG. 11A, the inversion unit 110B may recover the read flag FP to "111" and generate the data 112 based on the recovered read flag. By this method, correction may be made even when an error bit occurs in the first flag FP1 and the second flag FP2 on which an encoding operation is not performed.

The decoder 140B may obtain and output first data D1 113 by performing a first decoding operation on the data 112. For example, the decoder 140B may correct the error bits included in the third data D3 based on the third parity data P3, and output corrected data as the first data D1 113. In the case where the first decoding operation on the data 112 has failed, the decoder 140B may transmit a decoding failure report CRF to the inversion unit 110B.

Referring to FIG. 11B, the inversion unit 110B may generate and output data 114 including fourth data D4 and fourth parity data P4 by inverting the third data D3 and the third parity data P3 in response to the decoding failure report CRF. For example, in consideration of a case where the first decoding operation has failed as the third data D3 and the third parity data P3 are erroneously generated by the read flag FP which is uncorrectable in FIG. 11A, a second decoding operation may be performed for the fourth data D4 and the fourth parity data P4 generated by inverting the third data D3 and the third parity data P3.

The decoder 140B may obtain and output first data D1 115 by performing the second decoding operation on the data 114. For example, the decoder 140B may correct the error bits included in the fourth data D4 based on the fourth parity data P4, and output corrected data as the first data D1 115.

FIG. 12 is a flow chart of an operating method of the data storage device 10B of FIG. 9 for storing first data in response to a write request from an external device.

At step S310, the encoder 120B may generate first encoded data by performing an encoding operation on first data.

At step S320, the inversion unit 110B may generate first flagged encoded data by adding a first flag to the first encoded data.

At step S330, the controller 100B may perform a first write operation for storing the first flagged encoded data at a target position of the phase change memory region 200.

At step S340, the determination unit 130B may determine whether the first write operation has succeeded. When it is determined that the first write operation has succeeded, the process may be ended. When it is determined that the first write operation has failed, the process may proceed to step S350.

At the step S350, the inversion unit 110B may generate second flagged encoded data by adding a second flag to second encoded data obtained by inverting the first encoded data.

At step S360, the controller 100B may perform a second write operation for storing the second flagged encoded data at the target position.

At step S370, the determination unit 130B may determine whether the second write operation has succeeded. When it is determined that the second write operation has succeeded, the process may be ended. When it is determined that the second write operation has failed, the process may proceed to step S380.

At step S380, the controller 100B may set the target position as a bad region, and report a write failure to the external device.

FIGS. 13A and 13B are flow charts for explaining operating methods for the determination unit 130B of FIG. 9 for determining whether a first write operation has succeeded. Steps shown in FIGS. 13A and 13B may represent a detailed embodiment of the step S340 of FIG. 12.

Referring to FIG. 13A, at step S341A, the determination unit 130B may receive first verification data read from the target position. The first verification data may include first read data, first read parity data and a first read flag.

At step S342A, the determination unit 130B may count the number of error bits by comparing the first flagged encoded data with the first verification data.

At step S343A, the determination unit 130B may determine whether the number of error bit is equal to or less than a threshold. When the number of error bits is equal to or less than the threshold, the process may proceed to step S344A. When the number of error bits is greater than the threshold, the process may proceed to step S345A.

At step S344A, the determination unit 130B may determine that the first write operation has succeeded.

At step S345A, the determination unit 130B may determine that the first write operation has failed.

Referring to FIG. 13B, at step S341B, the determination unit 130B may receive first verification data read from a portion of the target position, where the first encoded data is stored. The first verification data may include first read data and first read parity data.

At step S342B, the determination unit 130B may count the number of error bits by comparing the first encoded data with the first verification data.

Steps S343B to S345B may be performed in the same manner as the steps S343A to S345A of FIG. 13A, and thus, detailed descriptions thereof will be omitted herein.

At step S370 of FIG. 12, a method of the determination unit 130B for determining whether the second write operation has succeeded may be substantially the same as the method shown in FIG. 13A or FIG. 13B.

Figure 14:
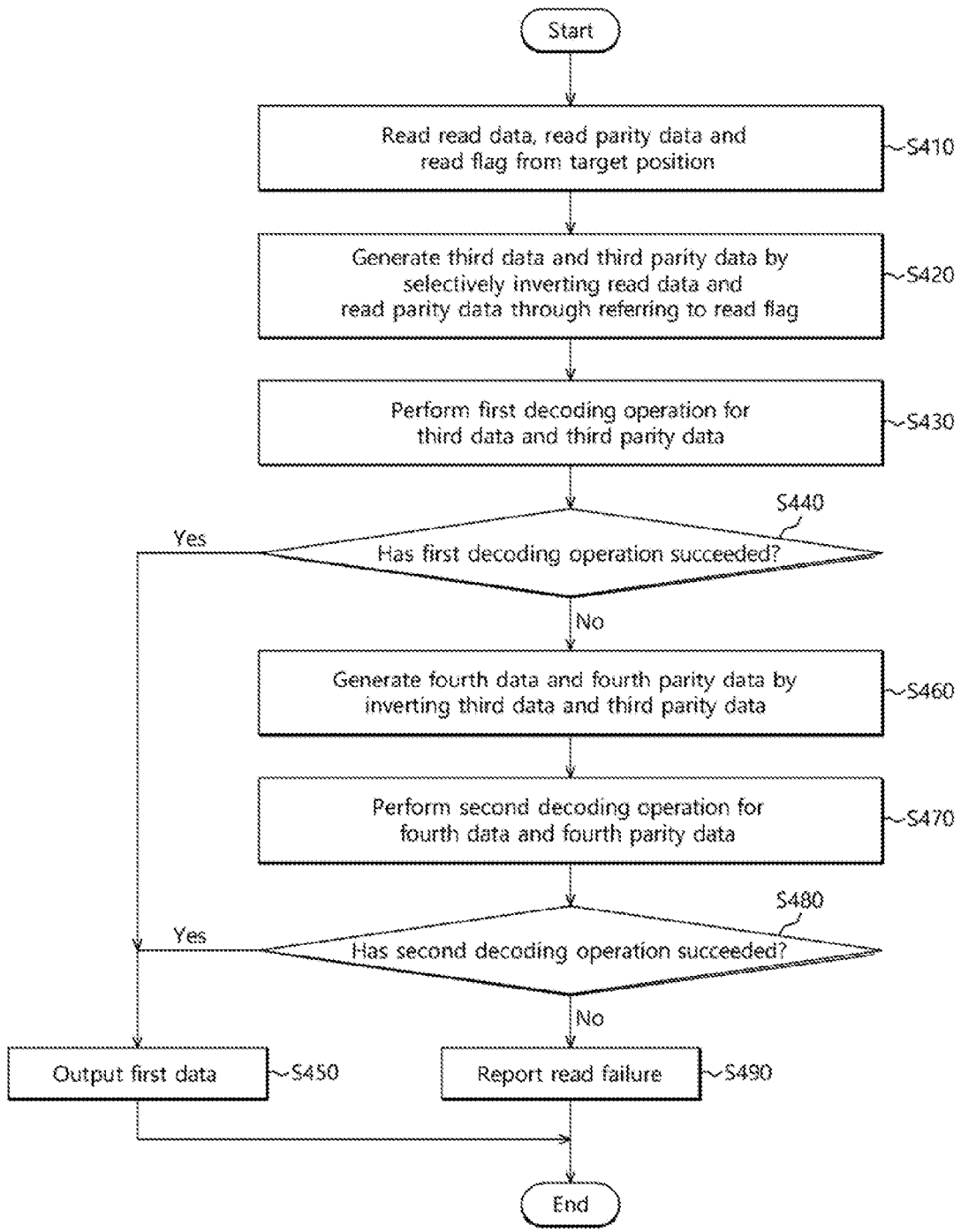
FIG. 14 is a flow chart of an operating method of the data storage device of FIG. 9 for reading and transferring first data in response to a read request from an external device.

FIG. 14 is a flow chart of an operating method of the data storage device 10B of FIG. 9 for reading and transferring first data in response to a read request received from an external device.

At step S410, the controller 100B may read read data, read parity data and a read flag from the target position of the phase change memory region 200.

At step S420, the inversion unit 110B may generate third data and third parity data by selectively inverting the read data and the read parity data by referring to the read flag. The inversion unit 110B may generate third data and third parity data by performing a decoding operation on the read flag based on a hamming distance, and selectively inverting the read data and the read parity data, based on a decoded read flag.

At step S430, the decoder 140B may perform a first decoding operation on the third data and the third parity data.

At step S440, the decoder 140B may determine whether the first decoding operation has succeeded. In the case where the first decoding operation has succeeded, the process may proceed to step S450. In the case where the first decoding operation has failed, the decoder 140B may transmit a decoding failure report and the process may proceed to step S460.

At step S450, the controller 100B may output the first data obtained through the first decoding operation, to the external device.

At the step S460, the inversion unit 110B may generate fourth data and fourth parity data by inverting the third data and the third parity data in response to the decoding failure report transmitted from the decoder 140B.

At step S470, the decoder 140B may perform a second decoding operation on the fourth data and the fourth parity data.

At step S480, the decoder 140B may determine whether the second decoding operation has succeeded. In the case where the second decoding operation has succeeded, the process may proceed to the step S450. In the case where the second decoding operation has failed, the process may proceed to step S490.

At the step S490, the controller 100B may report a read failure to the external device.

While the invention has been described in reference to the aforementioned described embodiments, it will be understood to those skilled in the art to which the present invention pertains that the described embodiments are provided as examples of the invention only. Accordingly, the data storage device and the operating method thereof described herein should not be limited to the described embodiments. It will be apparent to those skilled in the art to which the present invention pertains that various other changes and modifications may be made without departing from the spirit and scope of the invention as defined in the following claims.

What is claimed is:

1. An operating method of a data storage device, the operating method comprising:
   receiving first data;
   generating first flagged data by adding a first flag to the first data;
   generating first encoded flagged data by performing an encoding operation on the first flagged data;
   performing a first write operation for storing the first encoded flagged data in a target position of a phase change memory region;
   determining whether the first write operation succeeds or fails;
   generating second data by inverting the first data when it is determined that the first write operation fails;
   generating second flagged data by adding a second flag to the second data;
   generating second encoded flagged data by performing an encoding operation on the second flagged data; and
   performing a second write operation for storing the second encoded flagged data in the target position of the phase change memory region, used for performing the first write operation.

2. The operating method according to claim 1, wherein the determining of whether the first write operation succeeds or fails comprises:
   reading first verification data from the target position;
   counting the number of error bits by comparing the first encoded flagged data with the first verification data; and
   determining that the first write operation succeeds when the number is equal to or less than a threshold and determining that the first write operation fails when the number is greater than the threshold.

3. The operating method according to claim 1, further comprising:
   determining whether the second write operation succeeds or fails; and
   setting the target position as a bad region when it is determined that the second write operation fails.

4. The operating method according to claim 3, wherein the determining of whether the second write operation succeeds or fails comprises:
   reading second verification data from the target position;
   counting the number of error bits by comparing the second encoded flagged data with the second verification data; and
   determining that the second write operation succeeds when the number is equal to or less than a threshold and determining that the second write operation fails when the number is greater than the threshold.

5. The operating method according to claim 1, further comprising:
   receiving a read request for the first data;
   reading read data, a read flag and read parity data from the target position;
   correcting error bits of the read data and the read flag based on the read parity data, and generating decoded read data and a decoded read flag;
   obtaining the first data by selectively inverting the decoded read data by referring to the decoded read flag; and
   outputting the first data.

6. The operating method according to claim 1, wherein the data storage device comprises at least one phase change memory and at least one flash memory selected from the group consisting of a NAND flash and a NOR flash, and wherein the at least one phase change memory serves as a cache memory, a buffer memory or a working memory for the flash memory.

7. An operating method of a data storage device, comprising:
   generating first encoded data by performing an encoding operation on first data;
   generating first flagged encoded data by adding a first flag to the first encoded data;
   performing a first write operation for storing the first flagged encoded data in a target position of a phase change memory region;
   determining whether the first write operation succeeds or fails;
   generating second encoded data by inverting the first encoded data when it is determined that the first write operation fails;
   generating second flagged encoded data by adding a second flag to the second encoded data; and
   performing a second write operation for storing the second flagged encoded data in the target position of the phase change memory region, used for performing the first write operation.

8. The operating method according to claim 7, wherein the determining of whether the first write operation succeeds or fails comprises:
   reading first verification data from the target position;
   counting the number of error bits by comparing the first flagged encoded data with the first verification data; and
   determining that the first write operation succeeds when the number is equal to or less than a threshold and determining that the first write operation fails when the number is greater than the threshold.

9. The operating method according to claim 7, wherein the determining of whether the first write operation succeeds or fails comprises:
   reading first verification data from a portion of the target position, where the first encoded data is stored;
   counting the number of error bits by comparing the first encoded data with the first verification data; and
   determining that the first write operation succeeds when the number is equal to or less than a threshold and determining that the first write operation fails when the number is greater than the threshold.

10. The operating method according to claim 7, wherein the first flag is constructed by a plurality of bits which respectively have the same first value, and the second flag is constructed by a plurality of bits which respectively have the same second value.

11. The operating method according to claim 7, further comprising:
    determining whether the second write operation succeeds or fails; and
    setting the target position as a bad region when it is determined that the second write operation fails.

12. The operating method according to claim 11, wherein the determining of whether the second write operation succeeds or fails comprises:
    reading second verification data from the target position;
    counting the number of error bits by comparing the second flagged encoded data with the second verification data; and determining that the second write operation succeeds when the number is equal to or less than a threshold and determining that the second write operation fails when the number is greater than the threshold.

13. The operating method according to claim 7, further comprising:
receiving a read request for the first data;
reading read data, read parity data and a read flag from the target position;
generating third data and third parity data by selectively inverting the read data and the read parity data by referring to the read flag;
obtaining the first data by performing a first decoding operation on the third data and the third parity data; and
outputting the first data.

14. The operating method according to claim 13, further comprising:
generating fourth data and fourth parity data by inverting the third data and the third parity data when the first decoding operation fails;
obtaining the first data by performing a second decoding operation on the fourth data and the fourth parity data; and
outputting the first data.

15. The operating method according to claim 13, wherein the generating of the third data and the third parity data comprises:
generating a decoded read flag by performing a decoding operation on the read flag based on a hamming distance; and
generating the third data and the third parity data by selectively inverting the read data and the read parity data by referring to the decoded read flag.

* * * * *